United States Patent
Yagyu et al.

(10) Patent No.: US 7,259,408 B2
(45) Date of Patent: Aug. 21, 2007

(54) AVALANCHE PHOTODIODE

(75) Inventors: Eiji Yagyu, Tokyo (JP); Nobuyuki Tomita, Tokyo (JP); Eitaro Ishimura, Tokyo (JP); Masaharu Nakaji, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 256 days.

(21) Appl. No.: 11/098,558

(22) Filed: Apr. 5, 2005

(65) Prior Publication Data

US 2005/0230706 A1 Oct. 20, 2005

(30) Foreign Application Priority Data

Apr. 13, 2004 (JP) ............................. 2004-117889
Mar. 15, 2005 (JP) ............................. 2005-073367

(51) Int. Cl.
*H01L 21/0328* (2006.01)

(52) U.S. Cl. ........................ 257/186; 257/438
(58) Field of Classification Search ............... 257/186, 257/438
See application file for complete search history.

(56) References Cited

U.S. PATENT DOCUMENTS 5,552,629 A    9/1996   Watanabe 6,229,162 B1    5/2001   Watanabe

OTHER PUBLICATIONS

Isao Watanabe, et al. "High Speed, High-Reliability Planar-Structure Superlattice Avalanche Photodiodes for 10-Gb/s Optical Receivers", Journal of Lightwave Technology, vol. 18, No. 12, Dec. 2000, pp. 2200-2207.
U.S. Appl. No. 11/088,770, filed Mar. 25, 2005, Yagyu et al.
U.S. Appl. No. 11/098,558, filed Apr. 5, 2005, Yagyu et al.

*Primary Examiner*—Long Pham
(74) *Attorney, Agent, or Firm*—Oblon, Spivak, McClelland, Maier & Neustadt, P.C.

(57) ABSTRACT

An objective is to provide an avalanche photodiode that is excellent in device characteristics such as reliability. An avalanche photodiode is provided, which includes a substrate 1 formed with a light receiving region 3 on a multiplication layer 119, and formed with layers of differing semiconductor type with the multiplication layer 119 intervening, a ring-shaped groove 7 formed on the end face of the substrate 1 on its light-receiving-region side, in such a way that the groove surrounds the light receiving region 3, and one or more steps 5 provided on a side wall of the ring-shaped groove 7, in a range of from ¼ to ¾ of the depth of the groove. In the avalanche photodiode described above, because one or more steps provided on the side wall of the ring-shaped groove in the range of from ¼ to ¾ of the depth of the groove, discontinuity at the edge of the ring-shaped groove can be effectively prevented from occurring; consequently, an avalanche photodiode excellent in device characteristics such as reliability can be obtained.

20 Claims, 11 Drawing Sheets

AVALANCHE PHOTODIODE

BACKGROUND OF THE INVENTION

1. Field of the Invention

The present invention relates to a light receiving device for receiving light, and particularly to an avalanche photodiode that is excellent in device characteristics such as reliability and can be manufactured in a high yield.

2. Description of the Related Art

Avalanche photodiodes (hereinafter referred to as APDs) are excellent in device characteristics and may be manufactured in a high yield, therefore they have been applied to light receiving devices in optical-fiber communication systems, etc. Regarding the structures of these APDs, two types of structures, mesa-type and planar-type are known.

The mesa-type APD has a structure in which a depletion region of semiconductor layers such as a multiplication layer, an electric field-buffer layer, and a light absorption layer that are formed on an substrate is exposed to the surface. In detail, for example, a mesa-type APD disclosed in Japanese Laid-Open Patent Publication 312,442/1995 (Patent Document 1) has each of crystalline layers such as a $p^+$ type InP buffer layer, $p^-$ type InGaAs light absorption layer, a $p^+$ type InP field buffer layer, an $n^-$ type InAlGaAs/InAlAs super-lattice multiplication layer, an $n^+$ type InAlAs cap layer, and an $n^+$ type InGaAs contact layer that are grown on a $p^+$ type InP substrate. Then, a $p^+$ type conductive region is formed so as to surround a light receiving region that is formed at the center portion of the $n^+$ type InAlAs cap layer and the $n^+$ type InGaAs contact layer, and a ring-shaped groove that has a depth reaching the super-lattice multiplication layer is formed between the light receiving region and the $p^+$ type conductive region. In such a mesa type APD, a flip-chip-type electrode structure is mainly used, in which an electrode of another device is directly connected to the circular n-type electrode formed on the light receiving region, and detection light is incident from the back face of the APD.

On the other hand, the planar-type APD is structured in such a way that the depletion region of semiconductor layers such as a multiplication layer, an electric field-buffer layer, and a light absorption layer is not exposed to the surface, meanwhile a stable InP planar p-n junction, etc. is exposed to the surface. Because planar-type APDs are excellent in manufacturing and handling, recently they have been widely applied to optical communication fields, and their various improvements have been made.

For example, a conventional planar-type APD disclosed in Japanese Laid-Open Patent Publication 330,530/1999 (Patent Document 2) has a laminated structure composed of specific six layers on a semiconductor substrate, a specific conductive region provided on the outer circumference of a light receiving region, and a specific circular ring-shaped separation-groove region in the light receiving region. Moreover, in order to further decrease equipotential-line concentration at the light receiving edge, a circular ring-shaped region that is thinner than the thickness of a semiconductor multiplication layer is formed in a position inscribed in the circular ring-shaped separation groove provided on the outer circumference of the light receiving region in a second conductive-type semiconductor cap layer.

In each of the columnar n-type conductive layers, in order to prevent tunnel current flowing, a semiconductor layer composed of crystalline material having wider band gap is needed. Moreover, in order to reduce device resistance, the layer needs to be thicker than a certain value. Therefore, the depth of the ring-shaped groove is made relatively deep comparing to the thickness of an SiNx surface passivation layer or an n-type electrode. As a result, in the ring-shaped groove, especially at the edge of the groove, the thickness of the surface passivation layer becomes extremely thin or lost, that is, discontinuity occurs; thereby, protection of the covered portion becomes not enough, causing a problem in which device characteristics such as electrical characteristics and device reliability deteriorates.

Here, in an APD disclosed in Patent Document 2, a circular ring-shaped region is provided on the side wall of the light receiving region, as a result, it has a structure as provided with a step; however, because the step height is set to be as low as not more than the thickness of an avalanche multiplication layer, this method is not effective enough with respect to the discontinuity in the surface passivation layer, etc. occurring at the edge of the ring-shaped groove.

Also, in the device manufacturing process, when a resist, an SiNx film, or an SiOx film, etc. is used for a mask for performing various kinds of processes such as etching, the discontinuity at the edge of the ring-shaped groove occurs. As a result, such troubles as etching solution penetrates into a covered portion occurs during device fabrication; consequently, which has caused such problems as the device characteristics are deteriorated or a manufacturing yield is decreased.

Also, in the APD having the structure in which light is incident from the back face as disclosed in Patent Document 1, positional alignment to make light incident on the light receiving region is generally difficult, therefore it is preferable, from a viewpoint of operation, to adopt a structure in which light is incident on the surface. However, in the structure in which light is incident on the surface, because light is incident on it from the side of n-type conductive layers each surrounded by the ring-shaped groove, an external circuit cannot be provided on the light receiving region; consequently, an external electrode for connecting the region to the external circuit needs to be provided outside the light receiving region, that is, outside the ring-shaped groove. Therefore, in order to electrically connect the n-type electrode provided on the light receiving region inside the ring-shaped groove with the external electrode provided outside the ring-shaped groove, a lead needs to be provided for electrically connecting both the electrodes across over the ring-shaped groove. Accordingly, in the ring-shaped groove, especially at the edge of the groove, so-called discontinuity occurs in which the film thickness of the lead becomes extremely thin or the lead is broken; thereby, the electric characteristics has been deteriorated, causing a problem in which device characteristics such as device reliability worsens.

SUMMARY OF THE INVENTION

An objective of the present invention is to provide an avalanche photodiode that is excellent in device characteristics such as reliability.

The present invention provides an avalanche photodiode, which includes a substrate 1 formed with a light receiving region 3 on a multiplication layer 119, and formed with layers of differing semiconductor type with the multiplication layer 119 intervening, a ring-shaped groove 7 formed on the end face of the substrate 1 on its light-receiving-region side, in such a way that the groove surrounds the light receiving region 3, and one or more steps 5 provided on a side wall of the ring-shaped groove 7, in a range of from ¼ to ¾ of the depth of the groove.

In an avalanche photodiode such as that, one or more steps are provided on the side wall of the ring-shaped groove in the range of from ¼ to ¾ of the depth of the groove, therefore discontinuity at the edge of the ring-shaped groove can be effectively prevented from occurring; consequently, an avalanche photodiode that is excellent in device characteristics such as reliability can be obtained.

DETAILED DESCRIPTION OF THE PREFERRED EMBODIMENTS

Hereinafter, embodiments according to the present invention are explained based on figures.

Embodiment 1

Figure 1:
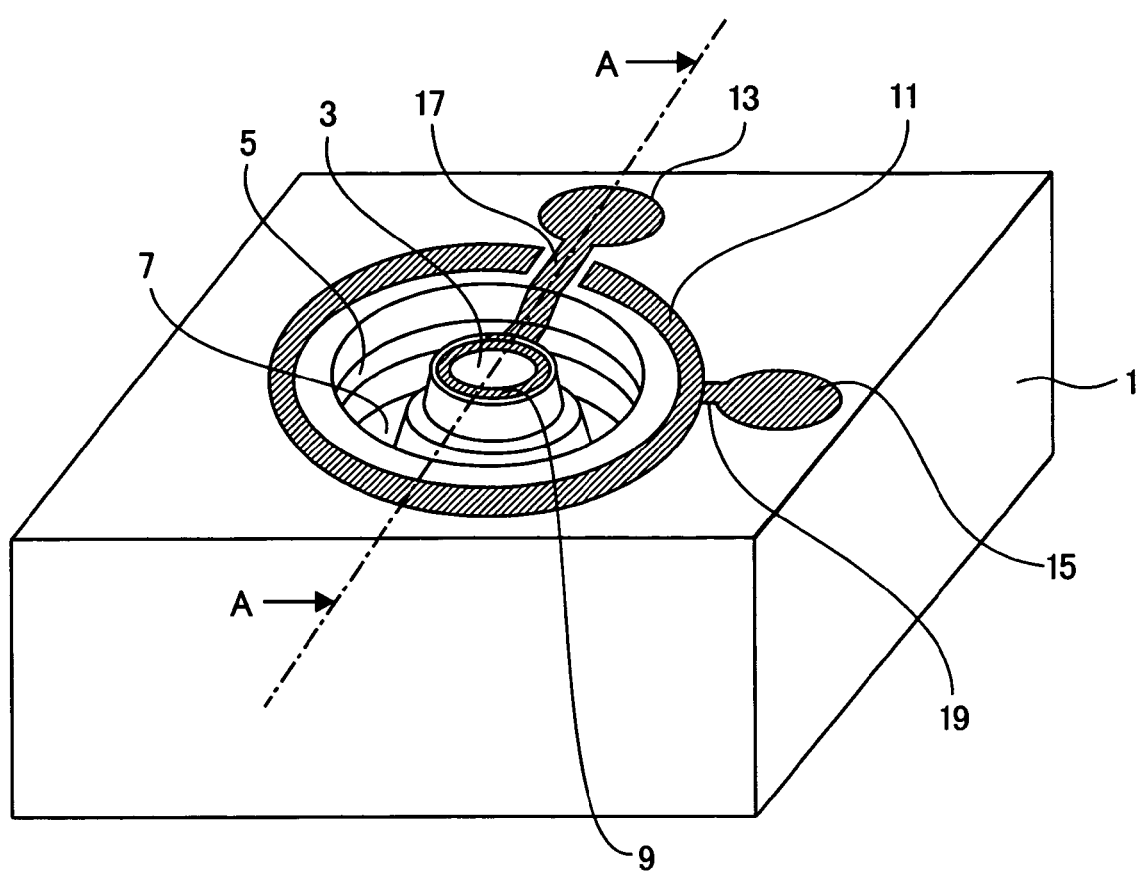
FIG. 1 is a perspective view illustrating a device structure of an avalanche photodiode according to Embodiment 1 of the present invention.
Figure 2:
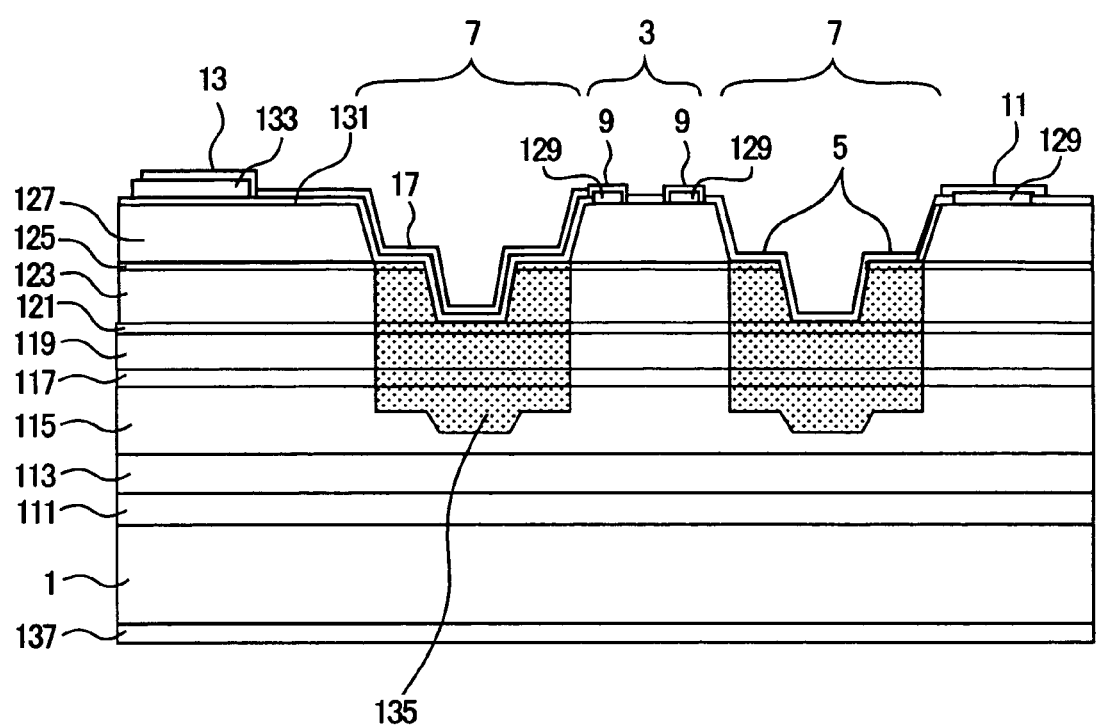
FIG. 2 is a cross-sectional view illustrating the avalanche photodiode along an A-A line represented in FIG. 1.
Figure 3:
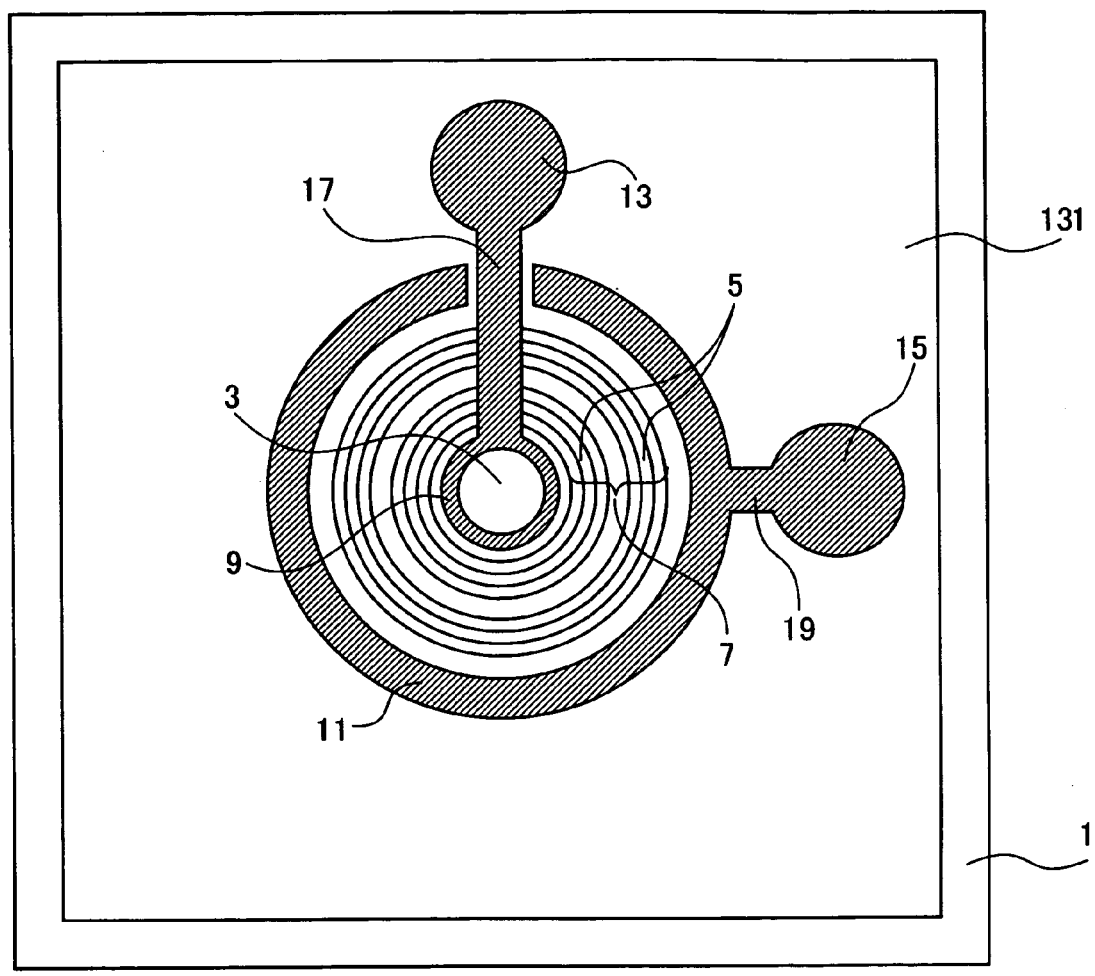
FIG. 3 is a top view illustrating the avalanche photodiode represented in FIG. 1.

FIG. 1 is a perspective view illustrating a device structure of an avalanche photodiode according to Embodiment 1. FIG. 2 is a cross-sectional view illustrating the avalanche photodiode along an A-A line represented in FIG. 1. FIG. 3 is a top view illustrating the avalanche photodiode represented in FIG. 1.

As illustrated in FIG. 1-FIG. 3, the avalanche photodiode (hereinafter referred to as the APD) is planar-type, in which a light receiving region 3 is formed on a multiplication layer provided on a substrate 1 composed of a semiconductor substrate, and the APD has a ring-shaped groove 7 in which one or more steps 5 are formed on the side wall of the light receiving region 3 so as to surround the light receiving region 3.

A circular ring-shaped first electrode 9 is formed on the light receiving region 3 that is formed on the internal region of the ring-shaped groove 7 on the end face of the side of the light receiving region 3 in the substrate 1, and a circular ring-shaped electrode 11 having a partially notched portion is also formed on the external region of the ring-shaped groove 7.

Moreover, a cathode electrode 13 (a second electrode) and an anode electrode 15 each are provided outside the circular ring-shaped electrode 11. The cathode electrode 13 is connected to the first electrode 9 via a lead (a first lead) 17 that is formed extending from the first electrode 9 to the cathode electrode 13 across over the ring-shaped groove 7, while the anode electrode 15 is connected to the circular ring-shaped electrode 11 via a lead (a second lead) 19.

In detail, in the substrate 1 as illustrated in FIG. 2, an $n^+$ type InP/GaInAsP distributed Bragg reflector 111, a $p^+$ type InP/GaInAsP distributed Bragg reflector 113, a $p^-$ type GaInAs light absorption layer 115, a $p^+$ type InP field buffer layer 117, an $n^-$ type AlInAs avalanche multiplication layer 119, a non-doped i-type InP stop-etch layer 121, an $n^+$ type AlInAs window layer 123, an $n^+$ type InP stop-etch layer 125, an $n^+$ type AlInAs window layer 127, and an $n^+$ type GaInAs contact layer 129 are formed on a semi-insulating InP substrate 1.

On the substrate 1, the ring-shaped groove 7 having the steps 5 across the window layer 127, the stop-etch layer 125, and the window layer 123 is also formed, that is, this groove 7 is formed from the end surface of the side of the light receiving region 3 in the substrate 1 to the upper portion of the avalanche multiplication layer 119 (the stop-etch layer 121). The regions of the window layers 123 and 127 surrounded by this groove 7 become the light receiving region 3.

Moreover, a passivation layer 131 being a protective layer is formed so as to cover at least the side walls of the ring-shaped groove 7 having the steps 5, that is, formed extending from the groove 7 to the top end face of the substrate 1. The first electrode 9 formed via the contact layer 129 on the light receiving region 3 and the cathode electrode 13 formed via a bonding pad 133 disposed outside the ring-shaped groove 7 are also connected with each other with the first lead 17 formed, across over the ring-shaped groove 7, on the passivation layer 131. Here, a die-bonding metal layer 137 is formed, on the opposite side of the light receiving region on the substrate 1.

A position in which the steps 5 are provided in the groove 7 is preferably determined within a range of from ¼ to ¾ of the depth between the bottom and the top of the groove 7, and the position at ½ height from the bottom, that is, the middle portion is more preferable. Setting within the range as described above prevents the height per step from becoming too large, so that discontinuity occurrence in the surface passivation layer or the lead that is formed on the side walls of the groove 7 can be effectively prevented.

Moreover, when the step height of the steps is close to the thickness of the avalanche multiplication layer, because the carrier concentration in the $p^+$ type InP field buffer layer just under the steps also further decreases, ion implantation condition can be further eased.

It becomes more preferable that the thickness of the first lead 17 formed on the groove 7 is made thicker than the height of the step. Structuring described above, an effect can be obtained in which discontinuity in the first lead 17 rarely occurs. Here, in this case, when the steps are configured to have equal height of each other, the thickness of the lead can be easily set thicker than each height of the steps.

Figure 4:
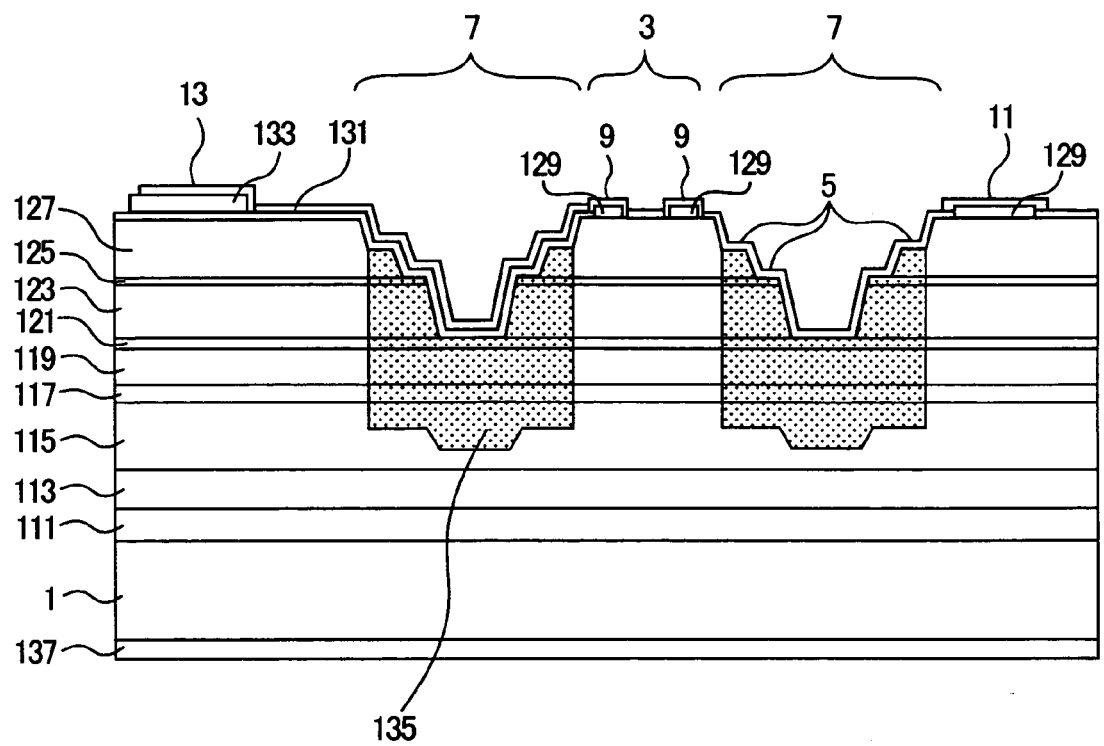
FIG. 4 is a cross-sectional view illustrating a device structure of another avalanche photodiode in Embodiment 1 of the present invention.

Moreover, the steps 5 may be provided only on the circumference of the inner side wall, only on the circumference on the outer side wall, or on the circumferences both of the side walls of the groove 7. Furthermore, one single step 5 may be provided on one of the side walls, or a plurality of steps may be provided on one of the side walls as represented in FIG. 4.

Next, a manufacturing method for the APD illustrated in FIG. 1 is explained FIG. 5-FIG. 8 are cross-sectional views explaining the manufacturing method for the avalanche photodiode illustrated in FIG. 1.

Figure 5:
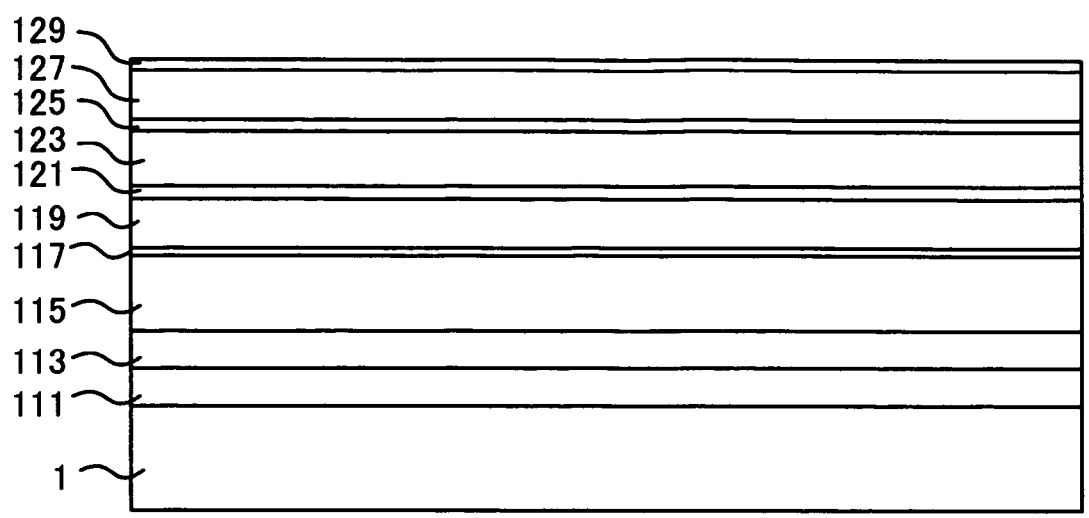
FIG. 5 is a cross-sectional view explaining a process for manufacturing the avalanche photodiode represented in FIG. 1.

As illustrated in FIG. 5, on the semi-insulating InP substrate 1, each of the n$^+$ type InP/GaInAsP distributed Bragg reflector 111, the p$^+$ type InP/GaInAsP distributed Bragg reflector 113, the non-doped i-type or p$^-$ type, GaInAs light absorption layer 115, for example, having the carrier concentration of $3\times10^{15}$ cm$^{-3}$, the p$^+$ type InP field buffer layer 117 having the carrier concentration of $0.5$-$1\times10^{18}$ cm$^{-3}$, the non-doped i-type AlInAs avalanche multiplication layer 119, the non-doped i-type InP stop-etch layer 121, the n$^+$ type AlInAs window layer 123 having the carrier concentration of $1$-$10\times10^{19}$ cm$^{-3}$, the n$^+$ type InP stop-etch layer 125 having the carrier concentration of $1$-$10\times10^{19}$ cm$^{-3}$, the n$^+$ type AlInAs window layer 127 having the carrier concentration of $1$-$10\times10^{19}$ cm$^{-3}$, and the n$^+$ type GaInAs contact layer 129 having the carrier concentration of $1$-$10\times10^{19}$ cm$^{-3}$ is sequentially made to epitaxial-crystal-grow. As an epitaxial-crystal-growth method such as this, a solid or gas source molecular beam epitaxy method (MBE), or a metal-organic vapor phase epitaxy method (MO-VPE), etc. is suitable.

The thickness of the reflector 111 may be set at 0.2-1.0 μm, the thickness of the reflector 113 at 1.0-4.0 μm, the thickness of the light absorption layer 115 at 1.0-1.5 μm, the thickness of the field buffer layer 117 at 0.01-0.05 μm, the thickness of the avalanche multiplication layer 119 at 0.1-0.3 μm, the thickness of the stop-etch layer 121 may be set at 0.005-0.05 μm, the thickness of the window layer 123 and the window layer 127 at 0.3-1.0 μm, the thickness of the stop-etch layer 125 at 0.005-0.1 μm, and the thickness of the contact layer 129 at 0.1-0.5 μm.

Here, the allowable range of the thickness of the window layers 123 and 127 may be suitably set within a range of 0.3-1.0 μm so as to satisfy a condition under the step position in a range from ¼ to ¾ of the height from the bottom of the groove.

Figure 6:
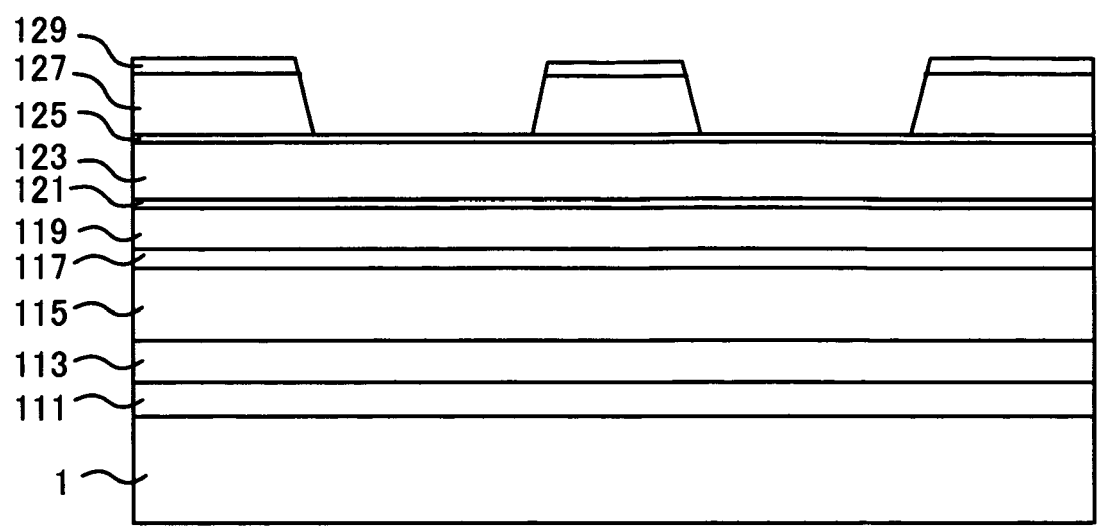
FIG. 6 is a cross-sectional view explaining a process for manufacturing the avalanche photodiode represented in FIG. 1.

Next, as illustrated in FIG. 6, the contact layer 129 and the window layer 127 in the ring-shaped region around the portion corresponding to the light receiving region are selectively removed from a wafer after epitaxial-crystal-growth, by etching, using mixed solution of an organic acid such as citric acid and tartaric acid, hydrogen peroxide solution, and water, until they reach the stop-etch layer 125 from the wafer surface in the above ring-shaped region. Here, as an etching mask, a resist pattern formed by a well known lithography technology, or an SiN$_x$ or SiO$_2$ pattern formed by the resist may be used.

Figure 7:
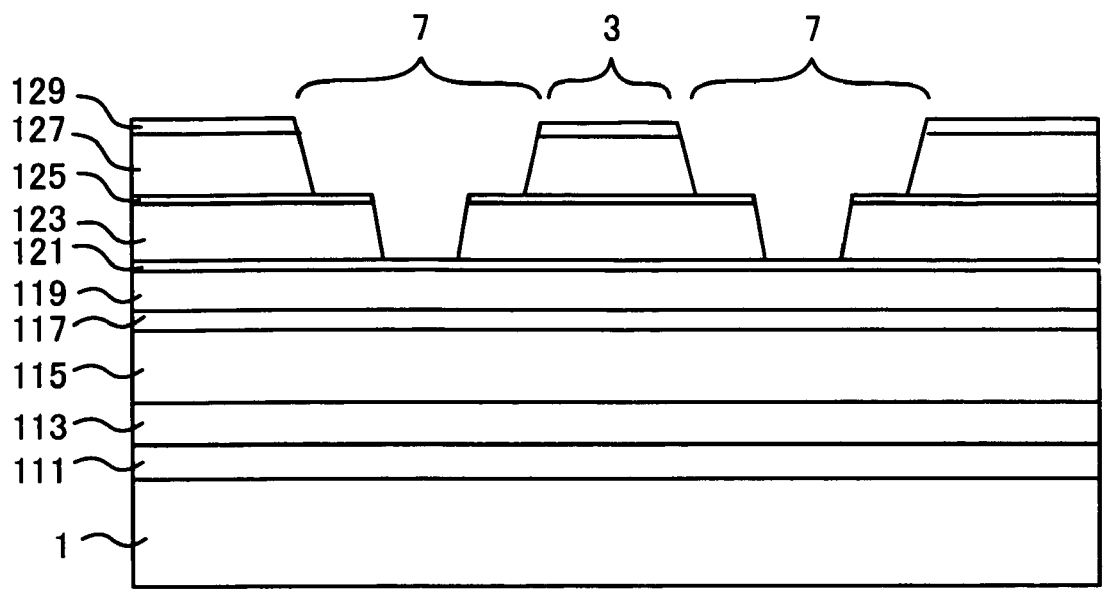
FIG. 7 is a cross-sectional view explaining a process for manufacturing the avalanche photodiode represented in FIG. 1.

Next, as illustrated in FIG. 7, only the stop-etch layer 125 exposed to the bottom face of the ring-shaped region described above is selectively removed by etching using mixed solution of hydrochloric acid and phosphoric acid Here, only the stop-etch layer 125 may be selectively removed by dry etching such as reactive ion etching (RIE) or reactive ion beam etching (RIBE),as removing methods other than the above wet etching method.

Subsequently, with respect to the ring-shaped region in which the stop-etch layer 125 has been removed, the window layer 123 is selectively removed by etching, using a resist pattern formed by a well known lithography technology or an insulating film pattern as an etching mask, and mixed solution of an organic acid, hydrogen peroxide solution, and water, until the layer reaches the stop-etch layer 121 under the window layer 123; thus, the columnar light receiving region 3 is formed. That is, the light receiving region 3 is surrounded by the ring-shaped groove 7 to the bottom of which the stop-etch layer 121 is exposed.

Figure 8:
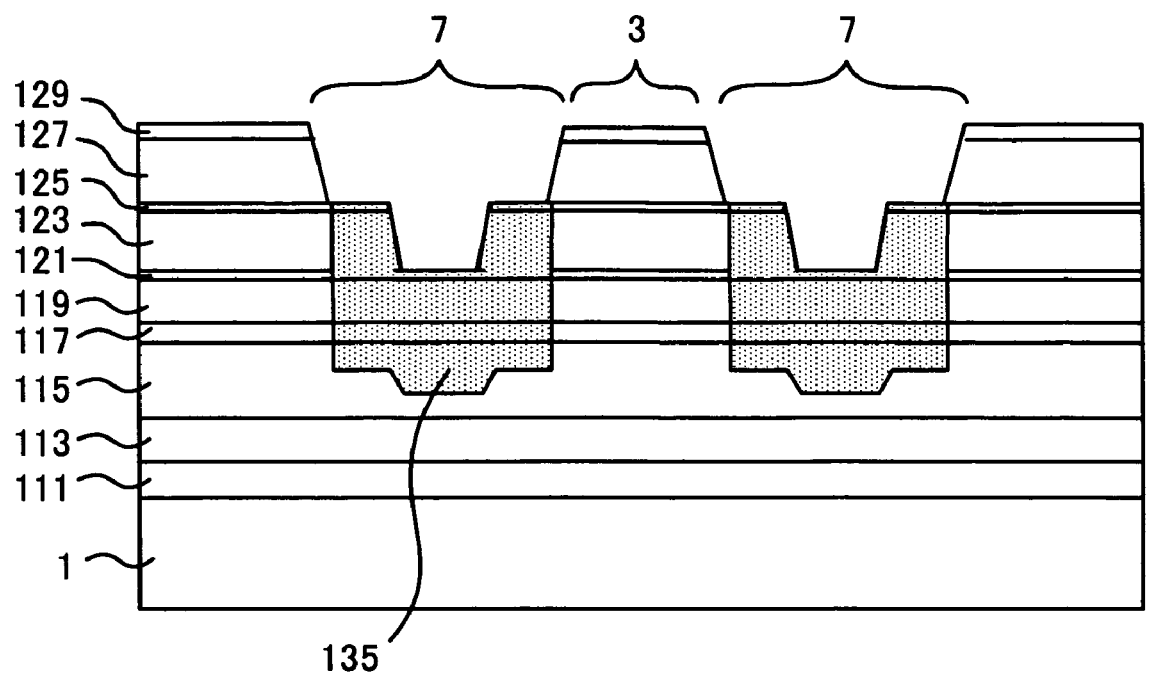
FIG. 8 is cross-sectional view explaining a process for manufacturing the avalanche photodiode represented in FIG. 1.

Moreover, as illustrated in FIG. 8, after titanium (Ti) ions for counteracting the p-type characteristics have been injected into the bottom-layer of the ring-shaped groove 7 so that the ion concentration peaks at the depth close to the field buffer layer 117, by activating the injected ions through heat treatment at temperature of not lower than 600° C., the carrier concentration in the p$^+$ type InP field buffer layer 117 around the light receiving region 3 is made to effectively decrease, so as to form a lower carrier concentration region 135. Here, as ion species to be injected, chemical elements such as H, He, N, C, O, Ar, B, and Fe other than Tr may be used. Because the carrier concentration in the p$^+$ type InP field buffer layer 117 just under the steps 5 also decreases through the heat treatment, the ion implantation condition can be eased.

Next, the contact layer 129 is selectively removed to form into a desired shape. Then, after a surface passivation layer (insulating layer) 131 that also serves as a reflection-preventing layer such as an SiNx layer has been formed on the wafer, the surface passivation layer 131 formed on the contact layer 129 is selectively removed, using a resist pattern formed by a well known lithography technology or an insulating film pattern as an etching mask, so as to form into a desired shape.

Moreover, as illustrated in FIG. 2, in order to reduce capacitance and to prevent an electrode from breaking and peeling off when bonding is performed, a bonding pad 133 made of SiOx, etc. is provided outside the light receiving region. The ring-shaped first electrode 9, made of metal alloy, such as AuZn/Au, Ti/Au, Pt/Ti/Au, and AuGe/Ni/Au, that contacts with the contact layer 129 is provided on the light receiving region 3. Then, the first lead (the lead electrode portion) 17 that is mainly disposed on the region of the ring-shaped groove 7 and that is connected with the first electrode 9 along the <0, 1, 1> orientation, and the cathode electrode (a first external electrode) 13 that is connected with the first lead 17 and that is disposed on the bonding pad 133 for bonding a gold wire for an electrical connection purpose with external circuits are provided.

Furthermore, the circular ring-shaped electrode 11 that is ring-shaped similarly to the ring-shaped groove 7 and that contacts with the contact layer 129 disposed outside the ring-shaped groove 7 is provided outside the groove; then, the second lead (the lead electrode portion) 19 led from this circular ring-shaped electrode 11, and the anode electrode (the second external electrode) 15 for bonding a gold wire connected with the second lead 19 are formed. On the back side of the semiconductor substrate 1, the metal layer 137 for bonding this device is formed.

As described above, in the APD according to Embodiment 1, by providing the steps in the ring-shaped groove surrounding the light receiving region, that is, by making it stepwise, the step height per step on the side wall of the groove can be decreased, therefore the discontinuity occurrence in the surface passivation layer and the lead, etc. at the edge of the ring-shaped groove can be easily prevented. As a result, the APD that is excellent in reliability and can be manufactured in a high yield can be provided.

Embodiment 2

Figure 9:
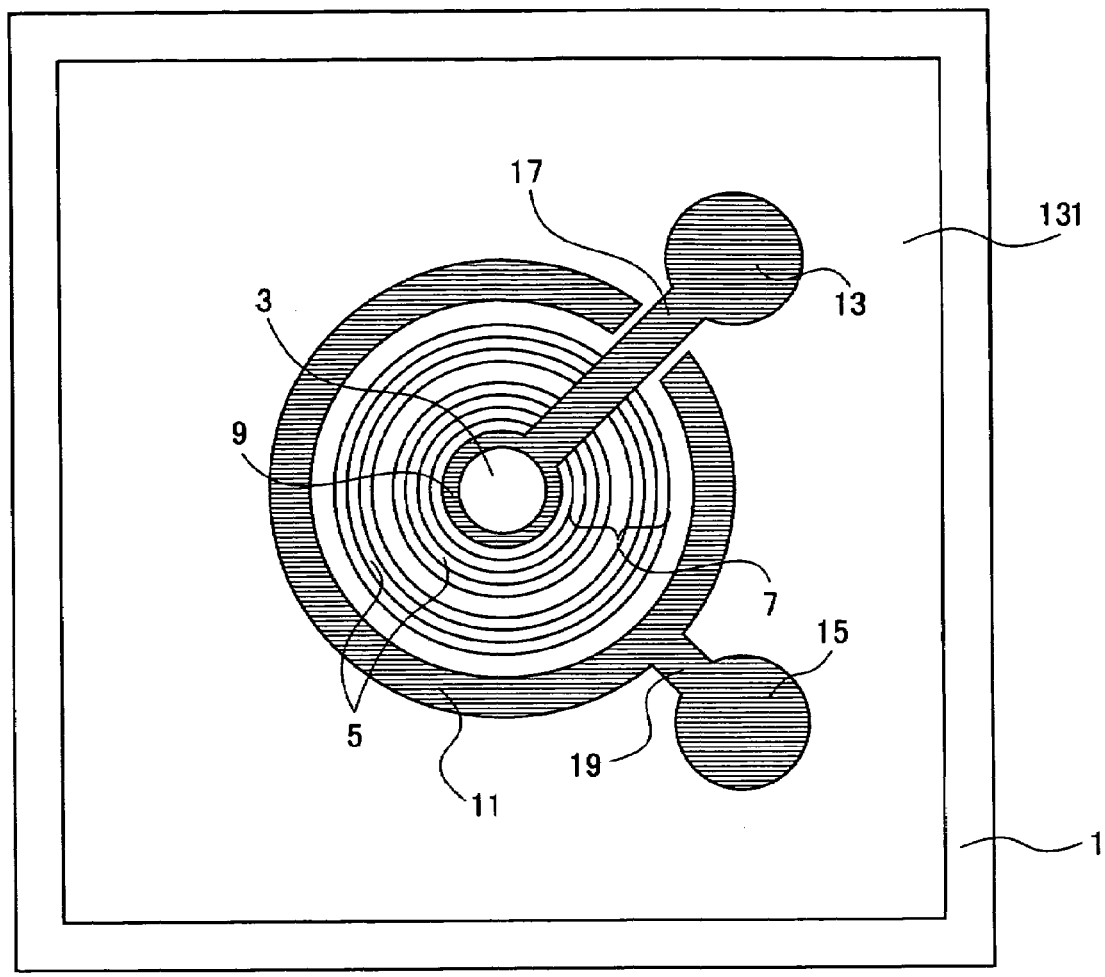
FIG. 9 is a top view illustrating an avalanche photodiode according to Embodiment 2 of the present invention.
Figure 9:
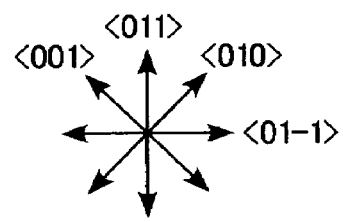

FIG. 9 is a top view illustrating an avalanche photodiode according to Embodiment 2. As illustrated in FIG. 9, in the APD according to this embodiment, in order to make the device size smaller, and also to prevent the discontinuity occurrence in the first lead 17 at the edge of the ring-shaped groove 7, the first lead 17 is made to lead along the <0, 1, 0> orientation with respect to the light receiving region 3, meanwhile the second lead 19 is made to lead along the orientation at approximately 90 degrees with respect to the first lead 17. Here, both the orientations coincide with those of the device diagonals.

Although, in this example, the first lead 17 is made to lead along the <0, 1, 0> orientation, the first lead may be made to lead along the <0, 1, 1> orientation. When the first lead 17 is led along the <0, 1, 0> or the <0, 0, 1> orientation with respect to the light receiving region 3, and the second lead 19 is led along an orientation at approximately 90 degrees with respect to the first lead 17, assuming that the semiconductor-substrate faces be the main faces, both the orientations correspond to those of the device diagonals determined by cleavage. Therefore, the electrodes can be provided dose to the device corners, so that the device can be made smallest, as well as the manufacturing yield of the device can be increased. Here, other structural elements are the same in embodiment 1.

Figure 10:
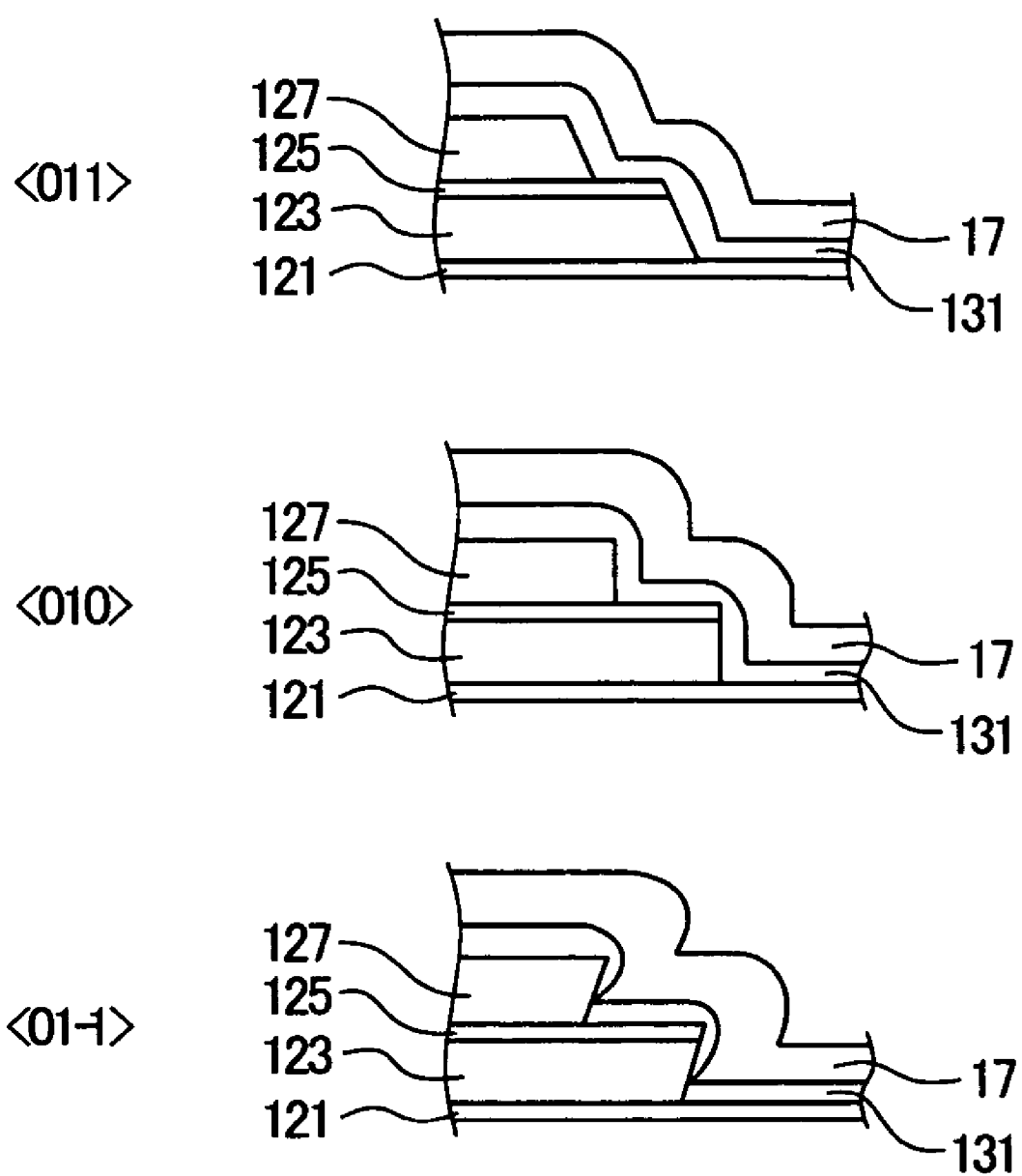
FIG. 10 is cross-sectional views illustrating periphery of side face of light receiving region when first lead is formed along the <0, 1, 1>, <0, 1, 0>, or <0, 1, −1> orientation.

FIG. 10 is cross-sectional views illustrating circumferential side face of the light receiving region 3 when the first lead is formed along the <0, 1, 1>, <0, 1, 0>, or <0, 1, −1> orientation.

As illustrated in FIG. 10, the shape along the <0, 1, 1> orientation is a normal mesa shape that extends towards the base, the shape along the <0, 1, 0> orientation is approximately perpendicular to the bottom face, and the shape along the <0, 1, −1> orientation is an reverse mesa shape in which the step width is narrow, and that narrows towards the base. Here, the shape along the <0, 0, 1> orientation is the same as that along the <0, 1, 0> orientation.

When the ring-shaped groove 7 is formed by etching using mixed solution of an organic acid, hydrogen peroxide solution, and water, due to the anisotropic etching rate, a normal mesa is shaped along the <0, 1, 1> orientation, in which the side-face of the light receiving region 3 extends towards the base, and, the more apart from the <0, 1, 1> orientation, the more it narrows towards the base. Therefore, when the first lead 17 is formed along the <0, 1, 1> orientation, the electrode, etc. can be formed without discontinuity occurrence; moreover, each of the columnar n-type conductive layers in the light receiving region can be made thick; consequently, the device resistance can be reduced, and its response speed can be increased.

In the APDs according to Embodiments 1 and 2, the first and the second external electrodes 13 and 15 are provided on the side of the light receiving region (the upper face) of the semiconductor substrate 1, therefore light incident from the side of the light receiving region (the upper side of the device) becomes possible. As a result, adjustment for controlling light from the exteriors to be incident on the light receiving region 3 becomes extremely easy.

Although, in the above explanation, a semi-insulating semiconductor substrate, as an example of the semiconductor substrate 1, has been represented, a p-type semiconductor substrate or an n-type semiconductor substrate may be used. Here, if the p-type semiconductor substrate is used, a semiconductor other than $n^+$ type one may be applied to the distributed Bragg reflector. If the n-type semiconductor substrate is used, the distributed Bragg reflector may be made to be an un-doped or an iron (Fe) doped semi-insulating conductive type.

In the above device structure, the avalanche multiplication layer is made of AlInAs; however, because material in which the ionizing rate of electrons is higher than that of holes can be adopted, the layer may be configured using a superlattice structure that is made of compound semiconductor including $Al_xGa_yIn_{1-x-y}As$, $Ga_xIn_{1-x}As_yP_{1-y}$, or antimony (Sb), or their mixture.

By reversing p-type into n-type of the conductive layers and viceversa described above each other, InP, etc. may be used, as the avalanche multiplication layer, in which the ionizing rate of holes is higher than that of electrons.

In this embodiment, by providing the $n^+$ type InP stop-etch layer 125, the position of the step on the side wall of the light receiving region is controlled; however, the step may be provided by a method of controlling etching time without the providing $n^+$ type InP stop-etch layer 125.

When a plurality of steps are provided, stop-etch layers each may be provided corresponding to each of the steps. Consequently, a stepwise structure can be easily manufactured.

Furthermore, regarding the lead electrode portion (the first lead) led from the first external electrode, the lead electrode portion, not limited to the case of the <0, 1, 1> orientation, may be led to an orientation in which the side-face base of the light receiving region extends towards the base rather than the side face being vertical, moreover it need not be a stepwise groove. In this case, from a viewpoint of device size, the position of the light receiving region may be off-center on the device.

Embodiment 3

Figure 11:
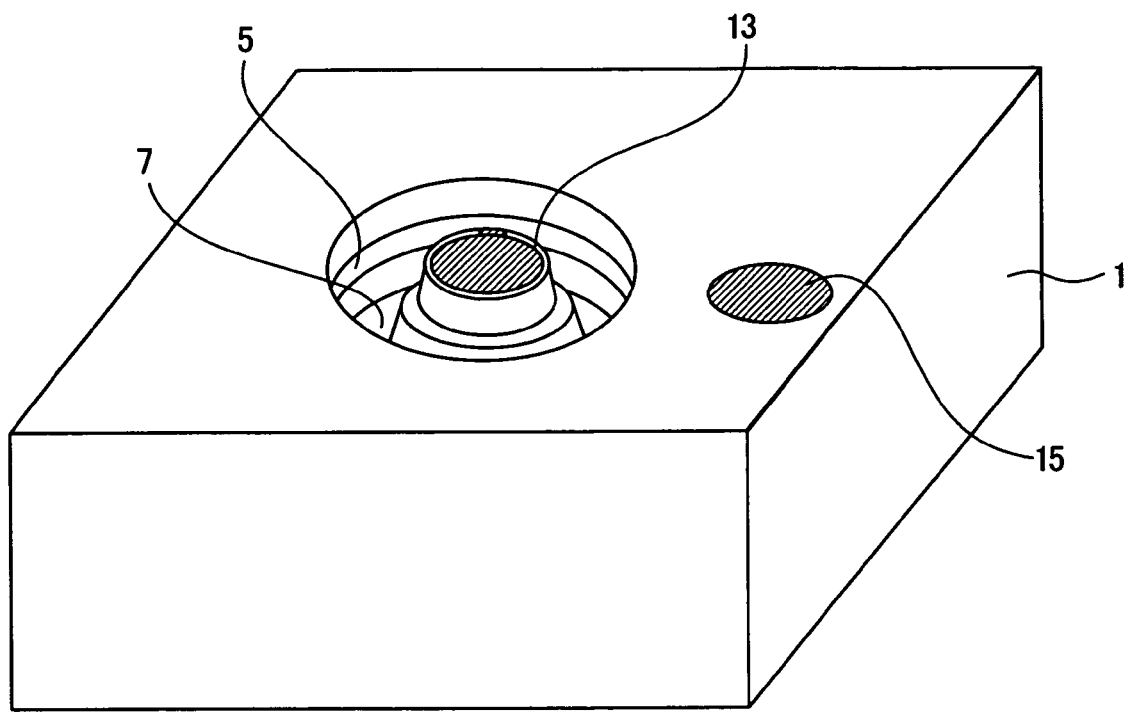
FIG. 11 is a perspective view illustrating an avalanche photodiode according to Embodiment 3 of the present invention.

In Embodiments 1 and 2, the APDs having surface-light-incident structures in which light is incident on the end face side of the light receiving region on the substrates are explained; however, the present invention may be applied to APDs having back-face-light-incident structures. FIG. 11 is a perspective view illustrating an avalanche photodiode having a back-face light-incident structure. The APD represented in FIG. 11 is structured in such a way that the first electrode on the light receiving region of the APD represented in FIG. 1 is made to be a cathode electrode, and also an anode electrode, the lead for electrically connecting the anode with the cathode electrode, the metal layer for bonding the device, and the reflector are removed. Here, other structural elements are the same as those in FIG. 1.

Although, as described above, the embodiments according to the present invention have been explained with referring to the figures, specific structures are not limited to these embodiments, but other structures may be included in the invention without departing from the spirit and scope thereof.

What is claimed is:
1. An avalanche photodiode comprising:
  a substrate formed with a light receiving region on a multiplication layer, and formed with layers of differing semiconductor type with the multiplication layer intervening;
  a ring-shaped groove formed on the end face of the substrate on the substrate's light-receiving-region side, in such a way as to surround the light receiving region; and one or more steps provided on a side wall of the ring-shaped groove, in a range of from ¼ to ¾ of the depth of the groove.

2. An avalanche photodiode comprising:
a substrate formed with a light receiving region on a multiplication layer, and formed with layers of differing semiconductor type with the multiplication layer intervening;
a ring-shaped groove formed on the end face of the substrate on the substrate's light-receiving-region side, in such a way as to surround the light receiving region; and
one or more steps provided on both of the outer and inner circumferential side walls of the ring-shaped groove respectively.

3. An avalanche photodiode comprising:
a substrate formed with a light receiving region on a multiplication layer, and formed with layers of differing semiconductor type with the multiplication layer intervening;
a ring-shaped groove formed on the end face of the substrate on the substrate's light-receiving-region side, in such a way as to surround the light receiving region;
one or more steps provided on a side wall of the ring-shaped groove;
a first electrode formed on the light receiving region;
a second electrode formed outside the ring-shaped groove, being formed in the end face of the substrate on the substrate's light-receiving-region side; and
a lead formed extending from the first electrode to the second electrode across the ring-shaped groove.

4. The avalanche photodiode as recited in claim 1, wherein light is incident into the light receiving region through the end face on the light-receiving-region side.

5. The avalanche photodiode as recited in claim 2, wherein light is incident into the light receiving region through the end face on the light-receiving-region side.

6. The avalanche photodiode as recited in claim 1, wherein a protection film is formed for covering at least the side wall of the ring-shaped groove including the step.

7. The avalanche photodiode as recited in claim 2, wherein a protection film is formed for covering at least the side walls of the ring-shaped groove including the step.

8. The avalanche photodiode as recited in claim 3, wherein a protection film is formed for covering at least the side wall of the ring-shaped groove including the step.

9. The avalanche photodiode as recited in claim 3, wherein the steps are provided on both of the outer and inner circumferential side walls of the ring-shaped groove.

10. The avalanche photodiode as recited in claim 2, wherein the step is provided in the ring-shaped groove in a range of from ¼ to ¾ of the depth of the groove.

11. The avalanche photodiode as recited in claim 3, wherein the step is provided in the ring-shaped groove in a range of from ¼ to ¾ of the depth of the groove.

12. The avalanche photodiode as recited in claim 1, wherein the step is provided in a single position at ½ of the depth of the ring-shaped groove.

13. The avalanche photodiode as recited in claim 10, wherein the step is provided in a single position at ½ of the depth of the ring-shaped groove.

14. The avalanche photodiode as recited in claim 11, wherein the step is provided in a single position at ½ of the depth of the ring-shaped groove.

15. The avalanche photodiode as recited in claim 1, wherein a stop-etch layer is formed under the bottom of the ring-shaped groove or the step.

16. The avalanche photodiode as recited in claim 2, wherein a stop-etch layer is formed under the bottom of the ring-shaped groove or the step.

17. The avalanche photodiode as recited in claim 3, wherein the side wall of the ring-shaped groove has a region whose cross-section is sequentially mesa-shaped, and the lead is formed on that region.

18. The avalanche photodiode as recited in claim 3, wherein the lead is formed along the <0, 1, 1> or the <0, 1, 0> orientation.

19. The avalanche photodiode as recited in claim 3, wherein, so as to lead in a direction that makes an angle of 90 degrees with said lead, another lead, bonded by wire bonding, is provided.

20. The avalanche photodiode as recited in claim 3, wherein the thickness of the lead is thicker than the height of the step.

* * * * *